United States Patent
Chen et al.

(10) Patent No.: US 11,929,722 B2
(45) Date of Patent: Mar. 12, 2024

(54) AUDIO CONTROL CIRCUIT AND ASSOCIATED CONTROL METHOD

(71) Applicant: Realtek Semiconductor Corp., HsinChu (TW)

(72) Inventors: Ko-Wei Chen, HsinChu (TW); Lun-Cheng Tsao, HsinChu (TW); Chi-Yih Lin, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 316 days.

(21) Appl. No.: 17/363,010

(22) Filed: Jun. 30, 2021

(65) Prior Publication Data

US 2022/0188063 A1    Jun. 16, 2022

Related U.S. Application Data

(60) Provisional application No. 63/124,027, filed on Dec. 10, 2020.

(30) Foreign Application Priority Data

Mar. 24, 2021  (TW) ................................ 110110561

(51) Int. Cl.
*G06F 3/16* (2006.01)
*H03G 3/34* (2006.01)

(52) U.S. Cl.
CPC ............. *H03G 3/348* (2013.01); *G06F 3/165* (2013.01)

(58) Field of Classification Search
None
See application file for complete search history.

(56) References Cited

U.S. PATENT DOCUMENTS

| | | | | |
|---|---|---|---|---|
| 5,818,948 A | * | 10/1998 | Gulick | ...................... H04R 3/00 381/2 |
| 5,914,877 A | * | 6/1999 | Gulick | ...................... H04R 1/04 381/2 |
| 6,122,749 A | * | 9/2000 | Gulick | .................. G06F 1/3228 381/2 |
| 2001/0003166 A1 | | 6/2001 | Gulick | |
| 2012/0054372 A1 | * | 3/2012 | Chen | ...................... G06F 9/4411 710/13 |

FOREIGN PATENT DOCUMENTS

| | | |
|---|---|---|
| JP | 2008-219855 A | 9/2008 |
| JP | 2017-68387 A | 4/2017 |
| TW | 200838128 | 9/2008 |

\* cited by examiner

*Primary Examiner* — Harry S Hong
(74) *Attorney, Agent, or Firm* — Winston Hsu

(57) ABSTRACT

The present invention provides an audio control circuit comprising an USB interface and a processing circuit is disclosed. The USB interface is used to connect to a host device, and the processing circuit is configured to perform enumeration with the host device via the USB interface, and the processing circuit is further configured to determine if the host device operates in a BIOS stage or an operating system stage to generate a control signal according to packets of the enumeration. When the processing circuit determines that the host device operates in the BIOS stage, the processing circuit generates the control signal to enable a de-pop circuit; and when the processing circuit determines that the host device operates in the operating system stage, the processing circuit generates the control signal to disable the de-pop circuit.

10 Claims, 2 Drawing Sheets

AUDIO CONTROL CIRCUIT AND ASSOCIATED CONTROL METHOD

CROSS REFERENCE TO RELATED APPLICATIONS

This application claims the priority of U.S. Provisional Application No. 63/124,027 (filed on Dec. 10, 2020), which is included herein by reference in its entirety.

BACKGROUND OF THE INVENTION

1. Field of the Invention

The present invention relates to an audio control circuit comprising an universal serial bus (USB) interface.

2. Description of the Prior Art

In an electronic device that has a speaker or is connected to an external speaker, when the electronic device is turned on, a codec of the internal audio control circuit or related circuits may generate noise during an initialization process, which causes the speaker to have pop sound, causing discomfort to users. In order to solve this problem, a de-pop circuit can be designed around the audio control circuit to reduce or eliminate the pop sound. However, since USB interface becomes popular in some audio control circuits and standard USB audio device firmware and driver do not teach the control of the eliminating the pop sound, how to use audio control circuits with USB interfaces to accurately control the operation of the de-pop circuit to effectively suppress popping without affecting normal audio playback is an important topic.

SUMMARY OF THE INVENTION

It is therefore an objective of the present invention to provide an audio control circuit, which can determine whether the electronic device is operating in a basic input/output system (BIOS) stage or an operating system (OS) stage based on signals from a host device, for controlling the de-pop circuit, to solve the above-mentioned problems.

In one embodiment of the present invention, an audio control circuit comprising an USB interface and a processing circuit is disclosed. The USB interface is used to connect to a host device, and the processing circuit is configured to perform enumeration with the host device via the USB interface, and the processing circuit is further configured to determine if the host device operates in a BIOS stage or an operating system stage to generate a control signal according to packets of the enumeration. When the processing circuit determines that the host device operates in the BIOS stage, the processing circuit generates the control signal to enable a de-pop circuit; and when the processing circuit determines that the host device operates in the operating system stage, the processing circuit generates the control signal to disable the de-pop circuit.

In another embodiment of the present invention, a control method of an audio control circuit comprises the steps of: performing enumeration with a host device through a USB interface circuit; determining if the host device operates in a BIOS stage or an operating system stage according to packets of the enumeration; when it is determined that the host device operates in the BIOS stage, generating a control signal to enable a de-pop circuit; and when it is determined that the host device operates in the operating system stage, generating the control signal to disable the de-pop circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
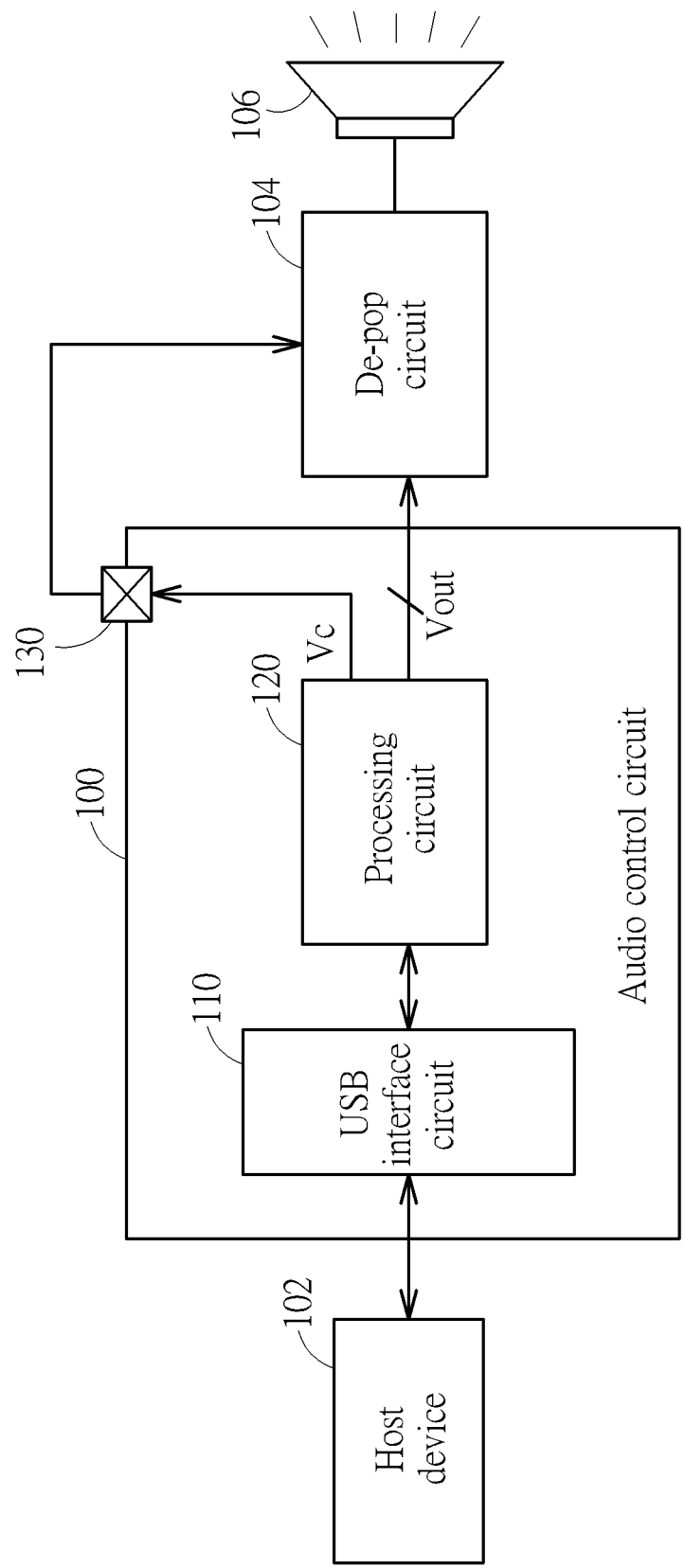
FIG. 1 is a diagram illustrating an electronic device according to one embodiment of the present invention.

FIG. 1 is a diagram illustrating an electronic device according to one embodiment of the present invention. As shown in FIG. 1, the electronic device comprises a host device 102, an audio control circuit 100, a de-pop circuit 104 and a speaker 106, wherein the audio control circuit 100 comprises an USB interface circuit 110, a processing circuit 120 and a specific pin 130. In this embodiment, the electronic device can be a computer, a notebook or any other electronic device with a sound playback function, and the audio control circuit 100 is a built-in audio device on the motherboard, that is, the host device 102, the audio control circuit 100 and the de-pop circuit 104 are fabricated on a motherboard. In addition, the speaker 106 can be an externally connected electronic device or a built-in device of the electronic device.

In this embodiment, the host device 102 may be a processor chipset in the electronic device, which is connected to the USB interface circuit 110 of the audio control circuit 100 through an USB interface, and the host device 102 transmits audio signals to the processing circuit 120 via the USB interface circuit 110 for related processing (for example, encoding and decoding, etc.), and then the audio control circuit 100 generates an output audio signal Vout to the speaker 106 for playback. However, as described in the prior art, when the electronic device is turned on, the codec of the audio control circuit 100 or related circuits may generate noise during the initialization process, thereby causing the speaker 106 to have pop sound. For the user of the electronic device, because the user does not need to hear the audio signal when the electronic device is just powered on (i.e., the BIOS stage), the de-pop circuit 104 can be enabled to avoid popping; but when the electronic device operates in the operating system stage (e.g., the electronic device starts to play a startup sound) or the user needs to hear the audio signal, the de-pop circuit 104 needs to be disabled so that the electronic device can play the sound normally. Therefore, the audio control circuit 100 of this embodiment can determine whether the host device 102 is operating in the BIOS stage or the operating system stage by referring to the packets in the enumeration process of the host device 102, so as to generate a control signal Vc to control the de-pop circuit 104 to block the output audio signal Vout from being transmitted to the speaker 106, or to reduce the volume of the output audio signal Vout to avoid popping when the electronic device is turned on. Specifically, when the processing circuit 120 determines that the host device 102 is currently operating in the BIOS stage by referring to contents of the packets in the enumeration process of the host device 102, the processing circuit 120 generates the control signal Vc to enable the de-pop circuit 104 to block the output audio signal Vout from being transmitted to the speaker 106, or the volume of the output audio signal Vout is reduced; and when the processing circuit 120 determines that the host device 102 is currently operating in the operating system stage by referring to the contents of the packets in the enumeration process of the host device 102, the processing circuit 120 generates the control signal Vc to disable the de-pop circuit 104, that is, the output audio signal Vout can be directly sent to the speaker 106 for playback.

In this embodiment, the audio control circuit 100 itself is a chip, and the specific pin 130 is one of multiple pins of the chip, and the de-pop circuit 104 is arranged outside the audio control circuit 100. In another embodiment, however, the audio control circuit 100 and the de-pop circuit 104 can be arranged in the same chip, that is, the control signal Vc generated by the audio control circuit 100 is transmitted to the de-pop circuit 104 through the internal wiring of the chip, without passing through the specific pin 130. This alternative design shall fall within the scope of the present invention.

Figure 2:
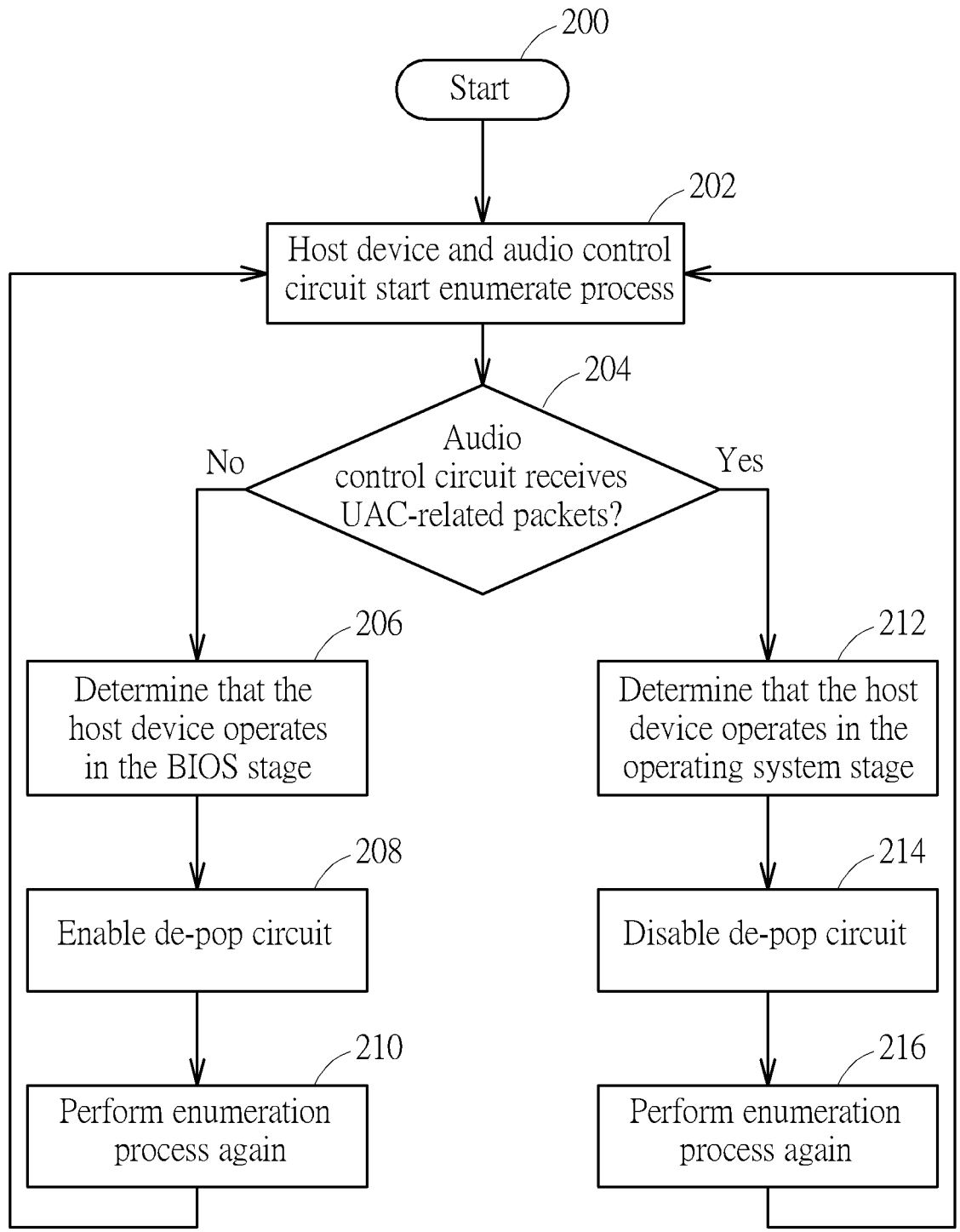
FIG. 2 is a flowchart of a control method according to one embodiment of the present invention.

FIG. 2 is a flowchart of a control method according to one embodiment of the present invention. In Step 200, the flow starts, and the electronic device is powered on for initialization. In Step 202, the host device 102 and the audio control circuit 100 start the enumeration process. During the enumeration process, the host device 102 sends an USB packet to the audio control circuit 100 and assigns an address. Then, the audio control circuit 100 reports the host device 102 to inform that it is an audio-enabled device and sends related information to the host device 102, such as a number of supported configurations, vendor ID, product ID, sample rate, volume range . . . etc.

Finally, the host device 102 recognizes the type of the audio control circuit 100, and transmits USB audio class (UAC) related packets to the audio control circuit 100. In one embodiment, the UAC-related packets are data packets generated by the host device 102, after the host device 102 successfully recognizes the type of the audio control circuit 100, for use by the audio control circuit 100, or for controlling the operation of the audio control circuit 100, such as setting the volume of the audio control circuit 100, setting the device comprising the audio control circuit 100 to mute or unmute, and/or setting the sample rate of the current operation of the audio control circuit 100. It should be noted that since a person skilled in the art should understand the detailed operation of the enumeration process, and the focus of this embodiment is to use the content of the packets in the enumeration process to determine whether to enable or disable the de-pop circuit 104, the above content only describes the main operations related to this embodiment during the enumeration process, and the other details of the enumeration process are omitted here.

In Step 204, the processing circuit 120 determines whether the UAC-related packets have been received, if not, the flow enters Step 206; if yes, the flow enters Step 212. In Step 206, since the processing circuit 120 has not received the UAC-related packets, the processing circuit 120 determines that the host device 102 is currently operating in the BIOS stage, that is, the host device 102 has not completed the related operations of recognizing the type of the audio control circuit 100. In Step 208, the processing circuit 120 generates the control signal Vc to enable the de-pop circuit 104 to block the output audio signal Vout from being transmitted to the speaker 106, or to reduce the volume of the output audio signal Vout. In Step 210, if the host device 102 notifies the audio control circuit 100 to perform the enumeration operation again, and the flow returns to Step 202.

In Step 212, since the processing circuit 120 has received the UAC-related packets, the processing circuit 120 determines that the host device 102 is currently operating in the operating system stage, that is, the host device 102 has completed the related operations of recognizing the audio control circuit 100. In the case of the Microsoft Windows operating system, the processing circuit 120 can determine that a screen of the current electronic device has displayed the Windows user interface. In Step 214, the processing circuit 120 generates the control signal Vc to disable the de-pop circuit 104, that is, the de-pop circuit 104 will not block the output audio signal Vout from being transmitted to the speaker 106 or reduce the volume of the output audio signal Vout, and the output audio signal Vout can be directly transmitted to the speaker 106 for playback. In Step 216, if the host device 102 notifies the audio control circuit 100 to perform the enumeration operation again, and the flow returns to Step 202.

Briefly summarized, in the audio control circuit and associated control method of the present invention, the audio control circuit determines whether the host device is operating in the BIOS stage or the operating system stage according to whether it has received UAC-related packets. When it is determined that the host device operates in the BIOS stage, the audio control circuit enables the de-pop circuit to avoid popping; and when it is determined that the host device operates in the operating system stage, the audio control circuit disables the de-pop circuit so that the speaker can play audio signals normally. Through the present invention, the audio control circuit with the USB interface can achieve the function of avoiding the popping phenomenon simply and effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio control circuit, comprising:
   an universal serial bus (USB) interface circuit, arranged to connect to a host device; and
   a processing circuit, coupled to the USB interface circuit, configured to perform an enumeration process with the host device via the USB interface circuit, and to determine if the host device is operating in a BIOS stage or an operating system stage to generate a control signal according to contents of packets during the enumeration process, wherein the BIOS stage indicates that the host device has not completed operations of recognizing a type of the audio control circuit;
   wherein when the processing circuit determines that the host device operates in the BIOS stage, the processing circuit generates the control signal to enable a de-pop circuit; and when the processing circuit determines that the host device operates in the operating system stage, the processing circuit generates the control signal to disable the de-pop circuit.

2. The audio control circuit of claim 1, wherein the processing circuit determines whether the host device is operating in the BIOS stage or the operating system stage according to a determination result indicating whether USB audio class (UAC) related packets are received from the host device to generate the control signal.

3. The audio control circuit of claim 2, wherein if the processing circuit does not receive the UAC-related packets, the processing circuit determines that the host device is operating in the BIOS stage, and generates the control signal to enable the de-pop circuit; and if the processing circuit receives the UAC-related packets, the processing circuit determines that the host device is operating in the operating system stage, and generates the control signal to disable the de-pop circuit.

4. The audio control circuit of claim 1, wherein the audio control circuit is arranged in a chip, and the control signal generated by the processing circuit is transmitted to the de-pop circuit located outside the chip through a specific pin of the chip.

5. The audio control circuit of claim 1, wherein the processing circuit is further configured to generate an output audio signal; and when the processing circuit determines that the host device is operating in the BIOS stage, the processing circuit generates the control signal to enable the de-pop circuit to block the output audio signal from being transmitted to a speaker or lower the volume of the output audio signal; and when the processing circuit determines that the host device is operating in the operating system stage, the processing circuit generates the control signal to disable the de-pop circuit, so that the output audio signal is directly transmitted to the speaker.

6. A control method of an audio control circuit, comprising:
 performing an enumeration process with a host device through an universal serial bus (USB) interface circuit;
 determining whether the host device is operating in a BIOS stage or an operating system stage according to contents of packets during the enumeration process, wherein the BIOS stage indicates that the host device has not completed operations of recognizing a type of the audio control circuit;
 when it is determined that the host device is operating in the BIOS stage, generating a control signal to enable a de-pop circuit; and
 when it is determined that the host device is operating in the operating system stage, generating the control signal to disable the de-pop circuit.

7. The control method of claim 6, wherein the step of determining whether the host device is operating in the BIOS stage or the operating system stage according to contents of packets during the enumeration process comprises:
 determining whether the host device is operating in the BIOS stage or the operating system stage according to a determination result indicating whether USB audio class (UAC) related packets are received from the host device to generate the control signal.

8. The control method of claim 7, wherein the step of determining whether the host device is operating in the BIOS stage or the operating system stage according to the determination result indicating whether the UAC-related packets are received from the host device to generate the control signal comprises:
 if the UAC-related packets are not received, determining that the host device is operating in the BIOS stage, and generating the control signal to enable the de-pop circuit; and
 if the UAC-related packets are received, determining that the host device is operating in the operating system stage, and generating the control signal to disable the de-pop circuit.

9. The control method of claim 6, wherein the audio control circuit is arranged in a chip, and the control signal is transmitted to the de-pop circuit located outside the chip through a specific pin of the chip.

10. The control method of claim 6, wherein the step of when it is determined that the host device is operating in the BIOS stage, generating a control signal to enable a de-pop circuit, and the step of when it is determined that the host device is operating in the operating system stage, generating the control signal to disable the de-pop circuit comprise:
 when it is determined that the host device is operating in the BIOS stage, generating the control signal to enable the de-pop circuit to block the output audio signal from being transmitted to a speaker or lower the volume of the output audio signal; and
 when it is determined that the host device is operating in the operating system stage, generating the control signal to disable the de-pop circuit, so that the output audio signal is directly transmitted to the speaker.

\* \* \* \* \*